(12) United States Patent
Chen et al.

(10) Patent No.: US 12,707,607 B2
(45) Date of Patent: Aug. 11, 2026

(54) SEMICONDUCTOR DEVICE

(71) Applicant: HITACHI ASTEMO, LTD., Hitachinaka (JP)

(72) Inventors: Ti Chen, Tokyo (JP); Takeshi Tokuyama, Tokyo (JP); Takahiro Araki, Tokyo (JP); Junpei Kusukawa, Tokyo (JP); Hiromi Shimazu, Tokyo (JP); Akihiro Namba, Tokyo (JP)

(73) Assignee: HITACHI ASTEMO, LTD., Hitachinaka (JP)

(*) Notice: Subject to any disclaimer, the term of this patent is extended or adjusted under 35 U.S.C. 154(b) by 274 days.

(21) Appl. No.: 18/709,936

(22) PCT Filed: Nov. 9, 2022

(86) PCT No.: PCT/JP2022/041768
§ 371 (c)(1),
(2) Date: May 14, 2024

(87) PCT Pub. No.: WO2023/090222
PCT Pub. Date: May 25, 2023

(65) Prior Publication Data

US 2026/0164626 A1 Jun. 11, 2026

(30) Foreign Application Priority Data

Nov. 16, 2021 (JP) ................................ 2021-186586

(51) Int. Cl.
*H05K 7/20* (2006.01)
*H10W 40/22* (2026.01)
(Continued)

(52) U.S. Cl.
CPC ...... *H05K 7/20927* (2013.01); *H10W 40/226* (2026.01); *H10W 90/10* (2026.01); *H10W 40/47* (2026.01)

(58) Field of Classification Search
CPC ........... H05K 7/20636; H05K 7/20772; H05K 7/20872; H05K 7/20927; H10W 40/47; H10W 40/226; H10W 90/10
See application file for complete search history.

(56) References Cited

U.S. PATENT DOCUMENTS 8,472,188 B2 * 6/2013 Horiuchi ............ H05K 7/20927 165/80.4
11,373,928 B2 * 6/2022 Heude .................. H10W 40/43
(Continued)

FOREIGN PATENT DOCUMENTS

JP 2001-308246 A 11/2001
JP 2007-110025 A 4/2007
(Continued)

OTHER PUBLICATIONS

International Search Report with English Translation and Written Opinion in corresponding International Application No. PCT/JP2022/041768, dated Jan. 10, 2023.

*Primary Examiner* — Jacob R Crum
(74) *Attorney, Agent, or Firm* — Foley & Lardner LLP

(57) ABSTRACT

This semiconductor device comprises: a plurality of power modules, each having a semiconductor element; a plurality of heat dissipation bases that are disposed via heat dissipation members on a heat dissipation surface side of the plurality of power modules, and that each have a heat dissipation fin; a frame having a plurality of openings; and a cover that covers the heat dissipation bases and the frame so as to form a refrigerant flow passage. The plurality of heat dissipation bases respectively close the plurality of openings. The cover has an elastic biasing part on a surface which contacts the heat dissipation fins. The heat dissipation bases are biased, by pressurization, toward the power modules.

13 Claims, 12 Drawing Sheets

(51) Int. Cl.
*H10W 90/10* (2026.01)
*H10W 40/47* (2026.01)

(56) References Cited

U.S. PATENT DOCUMENTS

| | | | | |
|---|---|---|---|---|
| 2001/0014029 | A1 | 8/2001 | Suzuki et al. | |
| 2012/0014066 | A1* | 1/2012 | Morino ................ | H10W 40/47 165/185 |
| 2020/0388556 | A1 | 12/2020 | Tsuyuno | |
| 2021/0378106 | A1* | 12/2021 | Iyengar ............... | H10W 40/254 |
| 2023/0023345 | A1 | 1/2023 | Tsuyuno et al. | |

FOREIGN PATENT DOCUMENTS

| | | | |
|---|---|---|---|
| JP | 2012-004405 | A | 1/2012 |
| JP | 2015-126117 | A | 7/2015 |
| JP | 2019-102561 | A | 6/2019 |
| JP | 2021-010200 | A | 1/2021 |
| JP | 2021-097101 | A | 6/2021 |

* cited by examiner 100
1
9
12
2
8
5
14
3

SEMICONDUCTOR DEVICE

TECHNICAL FIELD

The present invention relates to a semiconductor device.

BACKGROUND ART

As a background art of the present invention, Patent Literature 1 cited below discloses a configuration in which relative displacement between a fin 1 and a fin 2 causes the fin2 to deform along a module side face, thereby reducing a gap between the fin 2 and a module.

CITATION LIST

Patent Literature

Patent Literature 1: Japanese Unexamined Patent Application Publication No. 2015-126117

SUMMARY OF INVENTION

Technical Problem

A conventional water channel with a built-in fin that employs brazing/FSW (Friction Stir Welding) exhibits a high heat transfer coefficient owing to absence of a clearance for the fin. However, such a water channel does not have a function of following a variation in thickness of a plurality of circuit packages each of which is a circuit, and a TIM (Thermal Interface Material), which is a heat conductive material, is thickened, causing a problem of lowering cooling performance of the package. Moreover, in order to prevent degradation of the cooling performance due to the variation in the thickness of the circuit package, strict dimensional accuracy is required for a junction between the fin and a part covering it, which increases the cost thereof.

With this in mind, the present invention aims to provide a semiconductor device having a water channel structure that can retain high heat dissipation, the semiconductor device allowing for improvement in the productivity by reducing the cost of the components and fixing the variation in the package thickness.

Solution to Problem

A semiconductor device of the present invention includes: a plurality of power modules each having a semiconductor element; a plurality of heat dissipation bases arranged on a radiation surface side of the plurality of power modules via a heat dissipation member interposed therebetween and having radiation fins; a frame having a plurality of openings; and a cover forming a refrigerant flow path by covering the heat dissipation base and the frame, wherein the plurality of heat dissipation bases close the plurality of openings, respectively, and the cover has an elastic biasing part on a surface that contacts the radiation fin and biases the heat dissipation base by pressurizing the heat dissipation base toward the power module.

Advantageous Effects of Invention

It is possible to provide a semiconductor device that improves both productivity and heat dissipation.

BRIEF DESCRIPTION OF THE DRAWINGS

Figure 11:
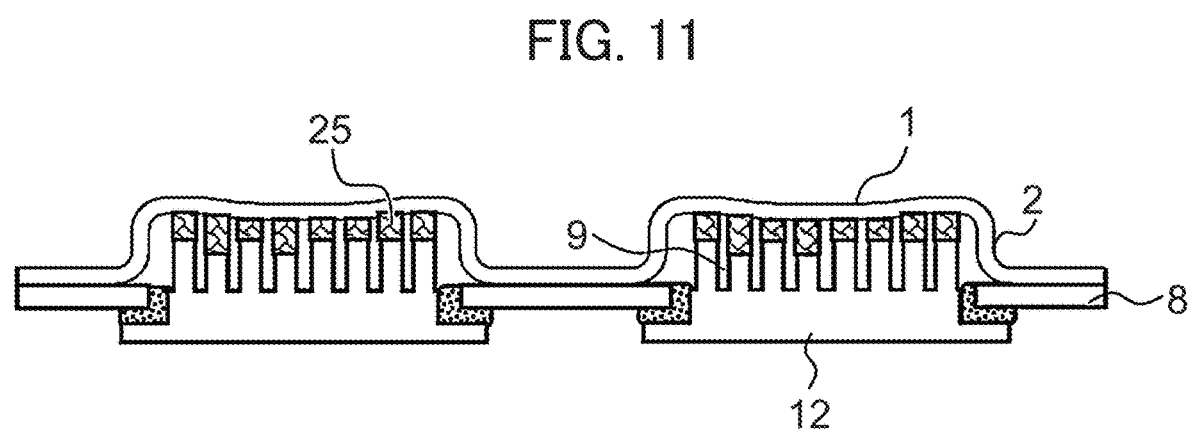

FIG. 11 illustrates a modification of FIG. 10 (seventh modification);

Figure 1:
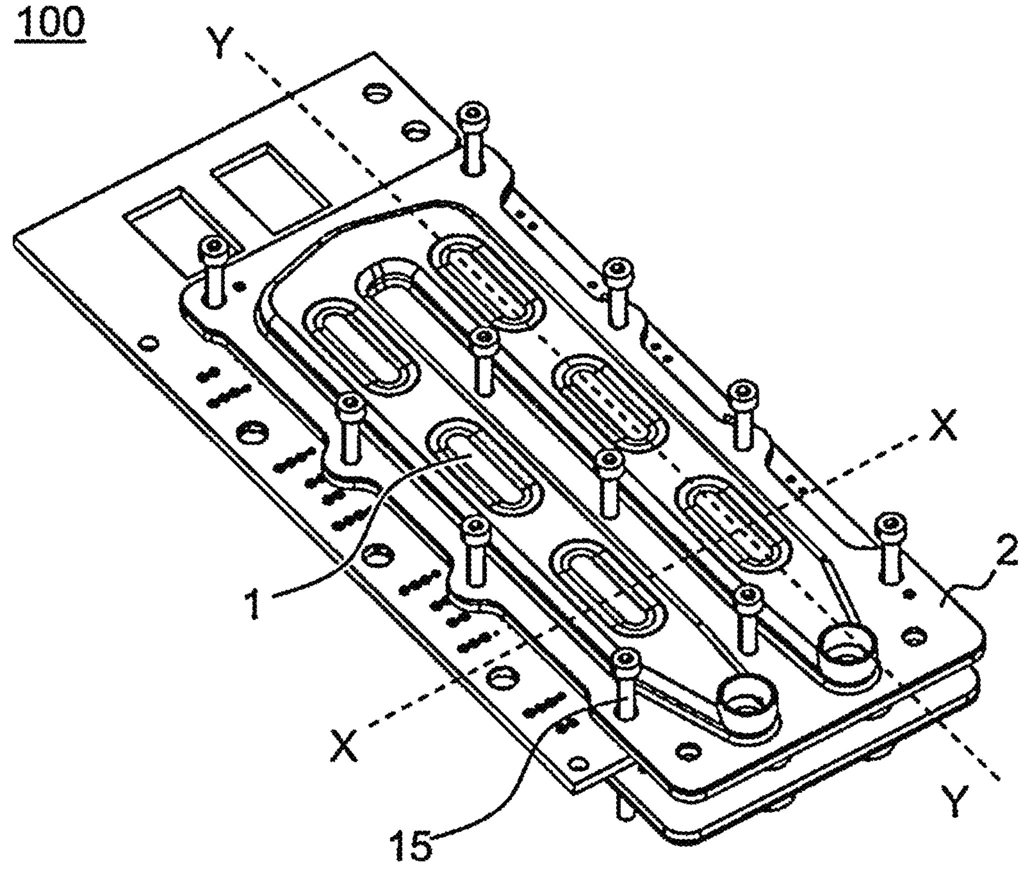
FIG. 1 is a general perspective view of a semiconductor device.
Figure 2:
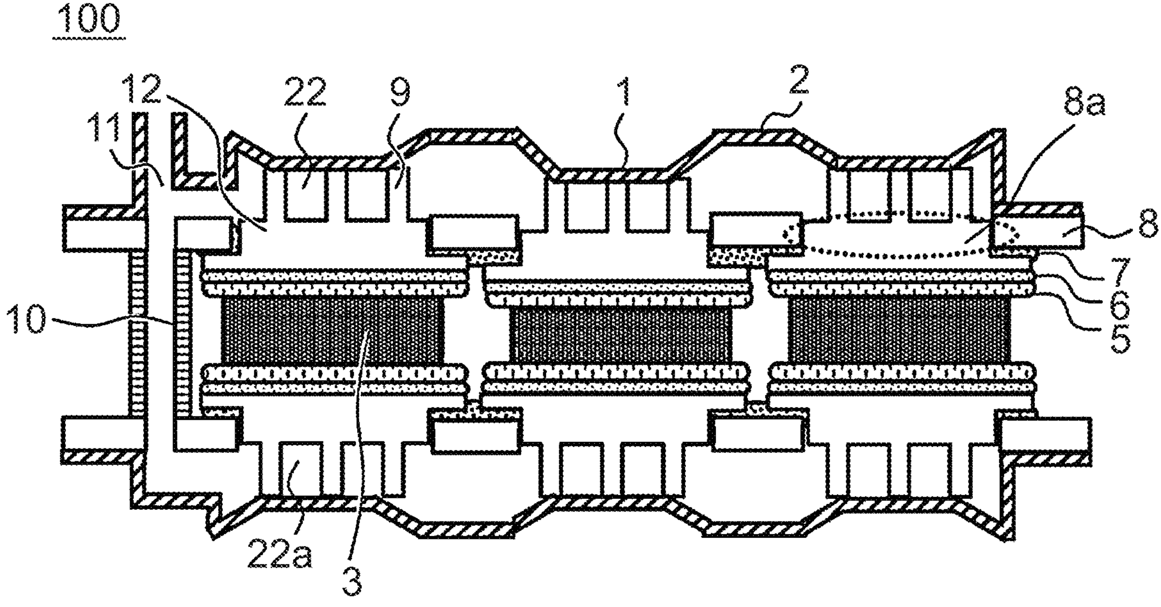
FIG. 2 is a Y-Y cross-sectional view according to an embodiment of the present invention.

In the following, embodiments of the present invention will be described with reference to drawings. The following descriptions and drawings are examples for explaining the present invention, some part of which may be omitted or simplified as appropriate for clarity. The present invention can also be implemented in various other forms. Unless otherwise specified, each component may be singular or plural.

Positions, sizes, shapes, ranges, and the like shown in the drawings may not show actual positions, sizes, shapes, ranges, and the like for easy comprehension of the invention. Accordingly, the present invention is not necessarily limited to the positions, sizes, shapes, ranges, and the like disclosed in the drawings.

(FIG. 1)

A semiconductor device 100 has a structure around a water channel for cooling a power module that includes a semiconductor element from both sides, and the water channel is formed by a cover 2 that includes an elastic biasing part 1. Structures of a connection member 15 and the water channel will be described later.

(FIG. 2)

A portion of the cover 2 is formed as the elastic biasing part 1, and each elastic biasing part 1 is provided at a position corresponding to each power module 3. A radiation fin 9 is arranged corresponding to each elastic biasing part 1, and the elastic biasing part 1 adheres to the radiation fin 9 by the cover 2 being pressurized during the production process. A heat dissipation base 12 is arranged at a position opposing the elastic biasing part 1 with the radiation fin 9 interposed therebetween.

A flow path 22 is formed by the elastic biasing part 1, the radiation fin 9, and the heat dissipation base 12. A refrigerant flowing in through a flow path entrance 11 is flowing through the flow path 22. In the case of the power module 3 for double side cooling, the refrigerant also flows into a flow path **22*a* on an opposite side through a piping component 10**.

The heat dissipation base 12 is mounted in a through hole **8*a* formed in a frame 8 and adhesion is improved by filling a gap between the heat dissipation base 12 and the frame 8 with a joining member 7 (seal member) to shut down. Moreover, the heat dissipation base 12 is in contact with the power module 3 on the radiation surface side thereof via an insulating member 6 and a heat dissipation member 5 (TIM) to be insulated from the power module 3 and dissipate heat. The heat dissipation member 5 is, for example, a material such as a resin and grease. One power module 3 corresponds to each heat dissipation base 12. The seal member 7 may be an adhesive, a rubber elastic material, a brazing material, or the like, which is deformable in a direction from the heat dissipation base 12 toward the power module 3 upon pressurizing the cover 2** in the production process.

Although the radiation fin 9 can be constructed so that the semiconductor device 100 handles all of the power modules 3 for three phases with the radiation fin 9 provided to the heat dissipation base 12, this structure is more likely to cause distortion due to the pressurization during the production process and also the refrigerant in the flow path 22 may leak due to the clearance between the cover 2 and the radiation fin 9. Therefore, overall distortion is reduced by splitting the heat dissipation base 12 into six parts so that the radiation fins 9 correspond to individual power modules 3, respectively. Moreover, by splitting the radiation fin 9 into six parts, it is possible to produce the radiation fins 9 that is easy to process with high precision, improving productivity of the semiconductor device 100.

In the semiconductor device 100, the openings of the power module 3 are closed by a plurality of radiation fins 9 and the heat dissipation base 12. The opening is a through hole 8*a* formed by the frame 8 and provided to each power module 3. This improves the bonding reliability.

In this manner, the adhesion between the radiation fin 9 and the power module 3 is improved while reducing the gap (clearance) conventionally generated at the tip of the radiation fin 9 by the distortion of the radiation fin 9 by elastic deformation of the elastic biasing part 1 provided to the water channel cover 2. The elastic deformation of the elastic biasing part 1 absorbs a thickness tolerance of the plurality of power modules 3. Similarly, the improvement in adhesion owing to the elastic deformation of the elastic biasing part 1 improves the cooling performance (heat transfer coefficient) of the device 100 by reducing a bypass flow of the refrigerant potentially occurring from the clearance between the cover 2 and the radiation fin 9 and also by increasing a flow rate of the refrigerant flowing through the flow path 22. Moreover, the radiation fin 9 being pressurized toward the power module 3 makes the TIM 5 the thinnest to improve the vibration resistance performance.

(FIG. 3)

Figure 3:
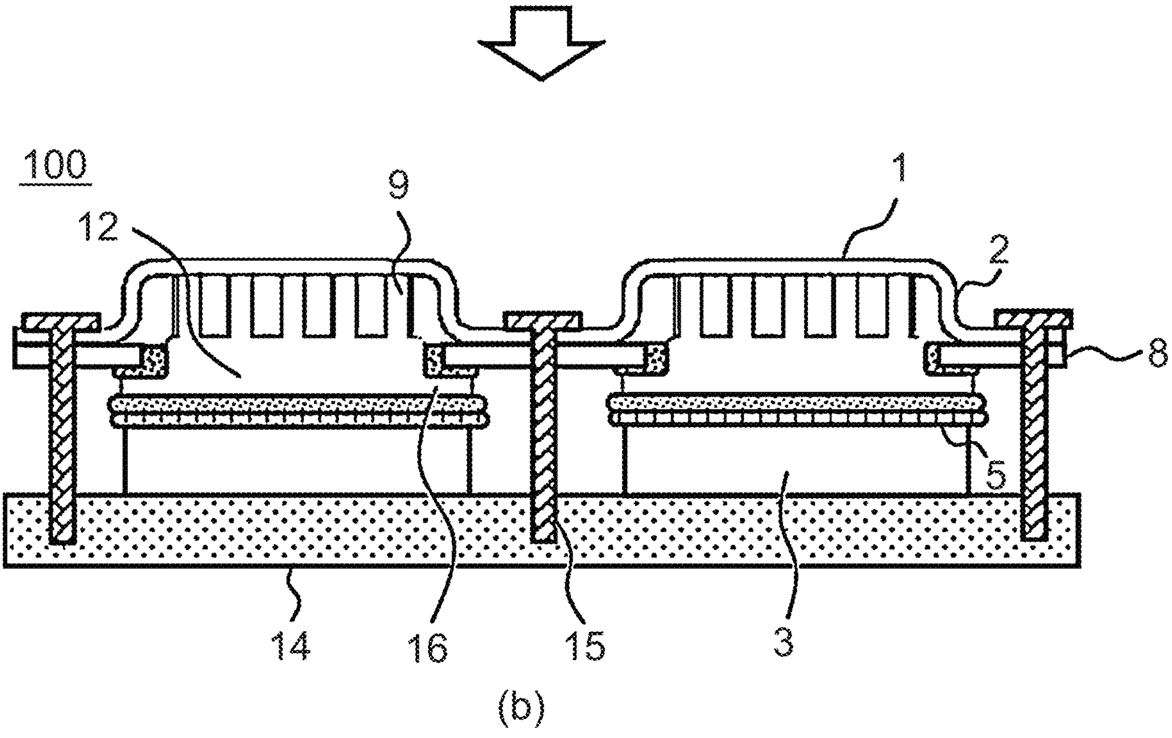
FIG. 3 is a X-X cross-sectional view according to an embodiment of the present invention.
Figure 4:
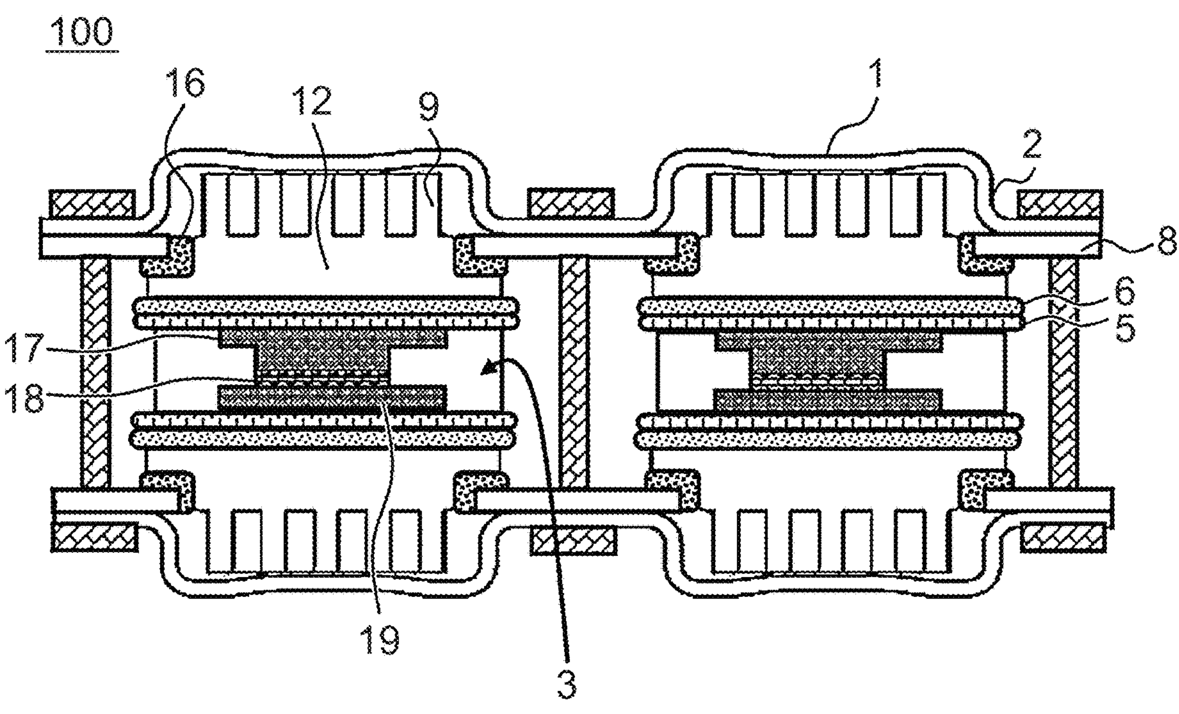
FIG. 4 illustrates a modification of FIG. 3 (first modification)
Figure 5:
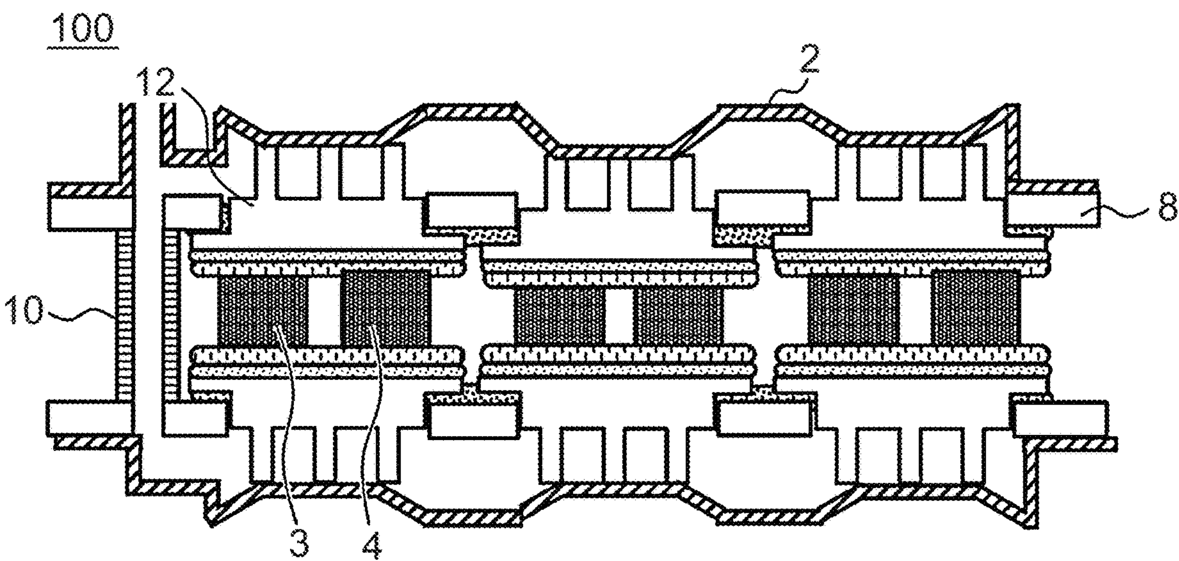
FIG. 5 illustrates a modification of FIG. 2 (second modification)
Figure 6:
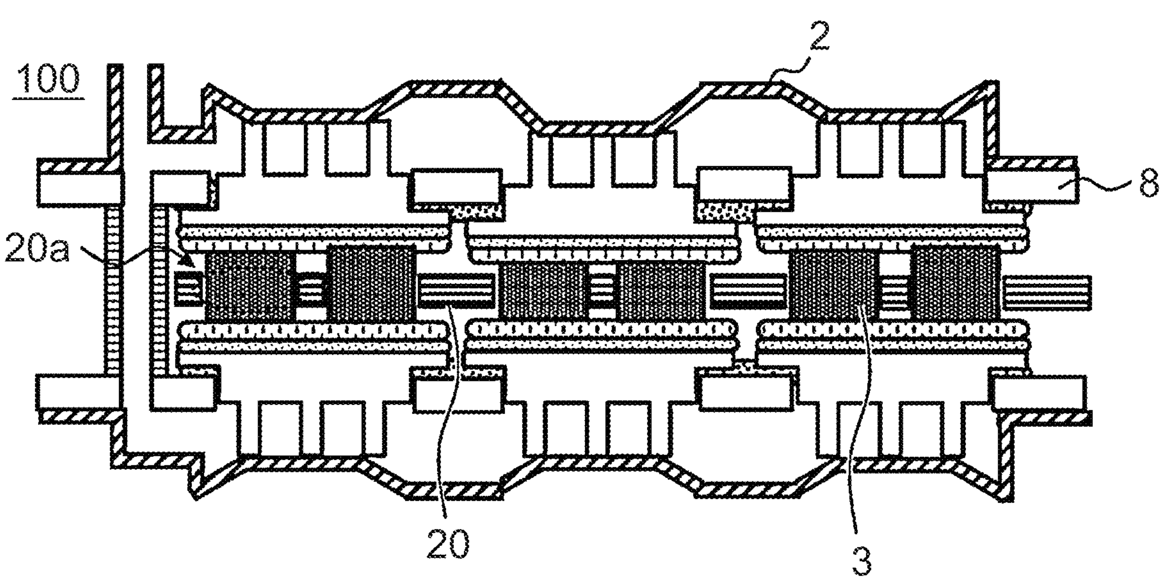
FIG. 6 illustrates a modification of FIG. 2 (third modification)
Figure 7:
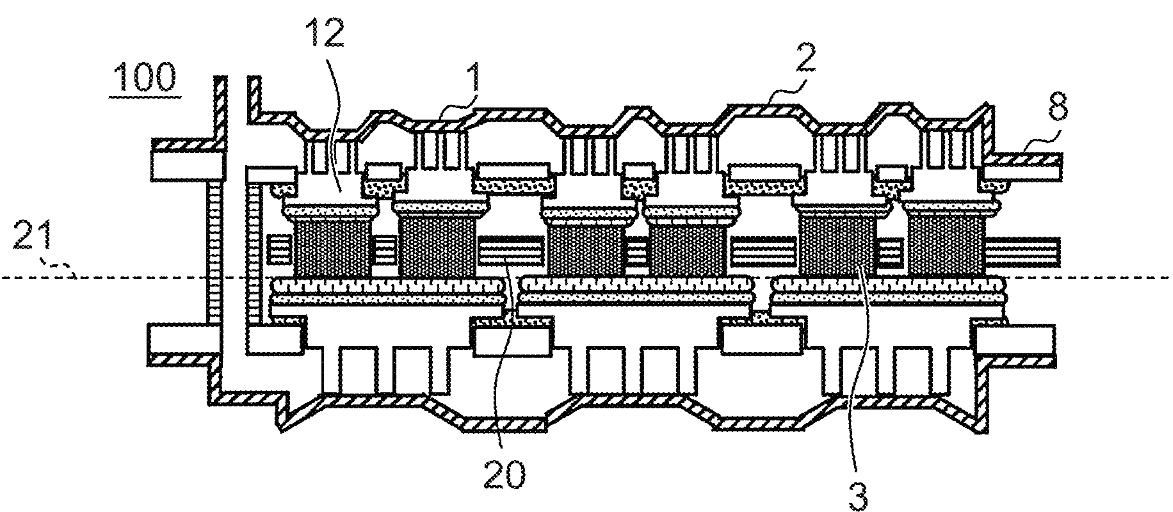
FIG. 7 illustrates a modification of FIG. 2 (fourth modification)

A process of pressurizing the power module 3 (package) by the elastic deformation of the elastic biasing part 1 is illustrated. The elastic biasing part 1 before being biased is formed in a wave shape of a material such as aluminum or spring elastomer in the cover 2 (FIG. 3 (*a*)). The elastic biasing part 1 is deformed by the connection member 15 fastening the cover 2 and the frame 8 thereto. After the deformation of the elastic biasing part 1, a contact area between the elastic biasing part 1 and the radiation fin 9 increases (FIG. 3 (*b*)). The radiation fin 9 is formed of a highly heat conductive member such as aluminum or copper. The connection member 15 is a fastening member such as a screw.

The power module 3 is applicable to the present invention even if it is bonded by FSW or welding, as long as it is not individually packaged. The connection by the connection member 15 does not have to be made by screwing. The radiation fin 9 and the cover 2 may be brazed together. Moreover, the cover 2 may be biased from a biasing side using another component mounted on the semiconductor device 100.

The connection member 15 is screwed at four corners of the elastic biasing part 1 (see FIG. 1). This allows the elastic biasing part 1 to keep pressure on the plurality of power modules 3. Moreover, the heat dissipation base 12 can improve bonding reliability.

In this manner, the radiation fin 9 is grounded to the elastic biasing part 1 to reduce an operation noise, thereby suppressing noise and vibration.

(Verification of Effect of the Invention by Comparison with Prior Art)

A comparison verification was performed between a prior-art structure including an extruded fin brazed thereto, which was assembled by screwing, and a structure of the present invention including a sheet metal case having a forged pin fin and a liquid seal member, which was also assembled by screwing. The cost was reduced from the prior-art structure owing to the radiation fin 9 of the present invention split into three parts. The heat transfer coefficient of the radiation fin 9 remained the same. It was found that, although the variation in the thickness of the TIM 5 in each power module 3 was not reduced below the target variation value (160 μm) with the prior-art technology, the inventive technology was able to reduce the variation below the target value, achieving reduction in the variation.

(First Modification)

(FIG. 4)

The power module 3 is constituted by a semiconductor element 18, a first circuit 17, and a second circuit 19. The power module 3 can be cooled from both sides via the heat dissipation base 12 and the radiation fin 9 by using the first circuit 17 and the second circuit 19 as heat dissipation circuits.

(Second Modification)

(FIG. 5)

The heat dissipation base 12 is provided with a plurality of power modules 3, 4 correspondingly at the same time. The heat dissipation base 12 can reduce the pressure on a junction between the power modules 3, 4 while retaining the pressurizing force applied thereto when handling many small power modules 3, 4, thereby improving the reliability.

(Third Modification)

(FIG. 6)

The power module 3 is mounted on a printed board 20 having a board through hole 20*a* (board opening) therein, thereby improving the assemblability including the printed board 20 and the heat dissipation, further making it easier to take a reference plane 21 described later.

(Fourth Modification)

(FIG. 7)

The power module 3 is mounted on the printed board 20, as described above, with the lower side aligned with the predetermined reference plane 21. This makes it possible to set the lower side of the power module 3 at a unified height and to arrange the plurality of power modules 3 for a single heat dissipation base 12. On the other hand, the upper side opposite from the reference plane 21 via the power module 3 therebetween is not a uniform plane due to the thickness tolerance of each power module 3. Therefore, on the upper side opposite from the reference plane 21, the thickness tolerance (variation) of the power module 3 is absorbed by the elastic biasing part 1 on one side of the power module 3 when pressurizing the cover 2 by arranging one power module 3 with respect to each heat dissipation base 12.

(Flow Path Structure of Semiconductor Device)

(FIG. 8)

Figure 8:
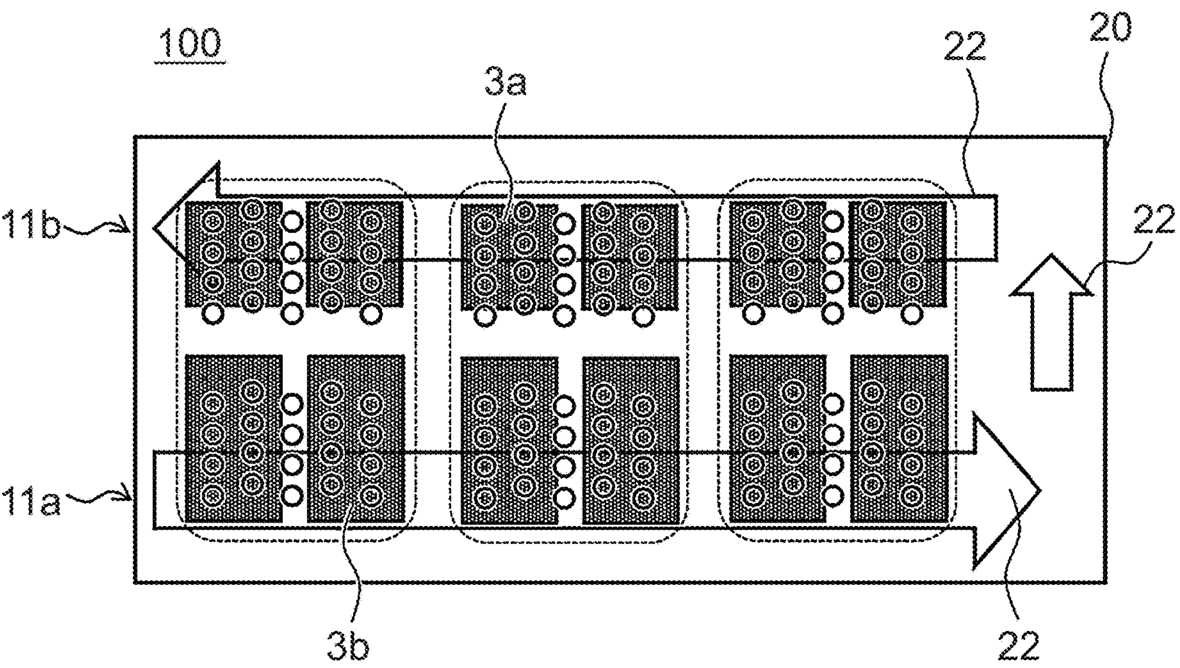
FIG. 8 illustrates a flow path structure of the semiconductor device according to an embodiment of the present invention.
Figure 9:
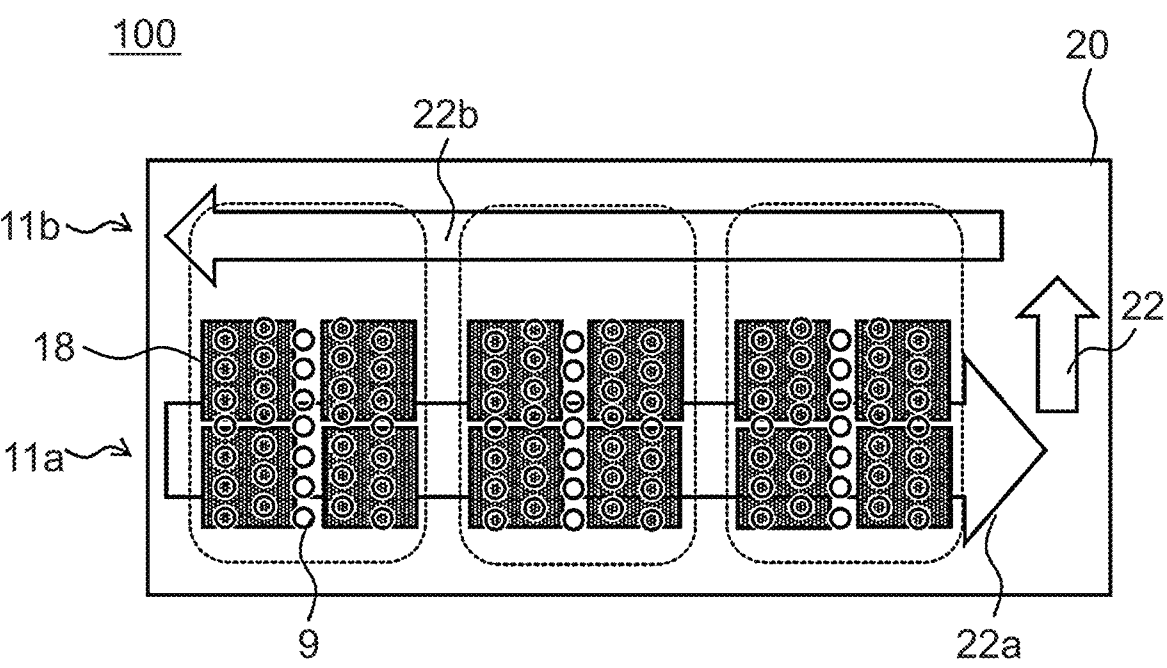
FIG. 9 illustrates a modification of FIG. 8 (fifth modification)
Figure 10:
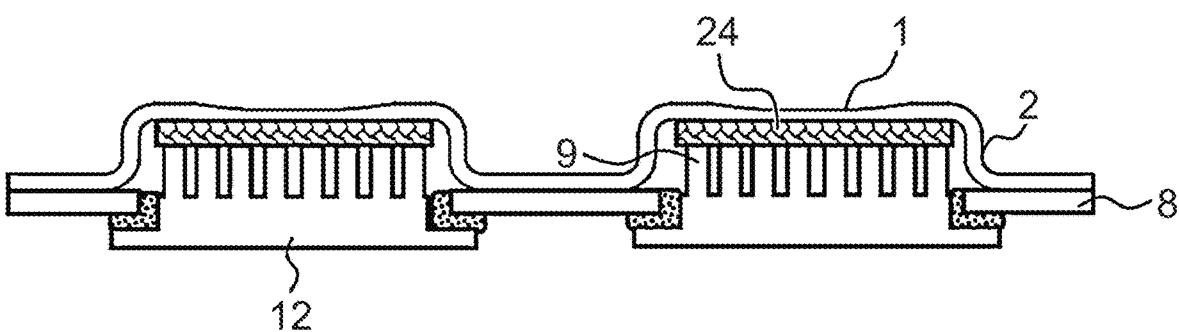
FIG. 10 illustrates a modification according to a joining part of a radiation fin and a cover (sixth modification)
Figure 12:
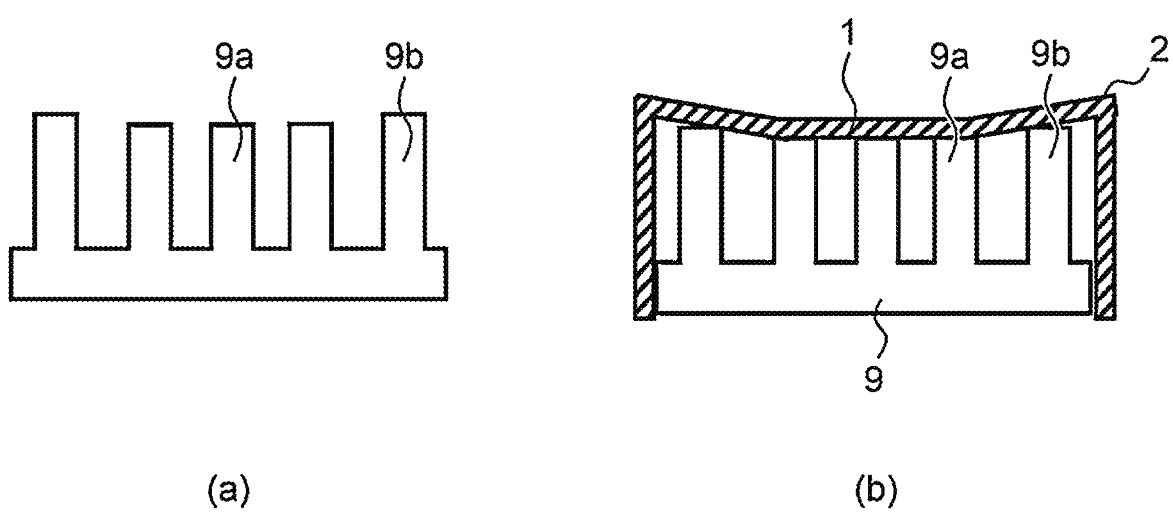
FIG. 12 illustrates a modification of FIG. 10 (eighth modification)

The flow path 22 is arranged on the printed board 20 in a U-shape (the bottom of the U is on the right side in FIG. 8), and a flow path inlet 11a and a flow path outlet 11b are disposed on the same side of the board 20 (on the left side in FIG. 8). Moreover, the flow path 22 coming from the flow path inlet 11a and the flow path 22 going toward the flow path outlet 11b are arranged equally on both sides. This reduces a floor area of the printed board 20.

The flow path 22 coming from the flow path inlet 11a is arranged on an IGBT 3b side having high heat dissipation among the semiconductor elements of the power module 3. On the other hand, the flow path 22 going toward the flow path outlet 11b is arranged on a diode 3a side having low dissipation in the power module 3. This improves the cooling effect.

(Fifth Modification)

(FIG. 9)

As for the flow path 22, when the semiconductor element 18 such as a SiC (silicon carbide) that requires uniform cooling is mounted on the board 20, the U-shaped flow path 22 is divided into the flow path 22a side on which the semiconductor elements 18 are concentrated and more heat is dissipated, and the flow path 22b side on which less semiconductor elements 18 are arranged and less heat is dissipated compared with the flow path 22a. At this time, the flow path width of the flow path 22a through which the refrigerant flows from the flow path inlet 11a is larger than the flow path width of the flow path 22b on the opposite side of the board 20 where the refrigerant flows in an opposite direction. Moreover, the flow path 22b that does not pass by the semiconductor element 18 is not provided with the radiation fin 9. This reduces the pressure loss.

(Sixth Modification)

(FIG. 10)

An elastic member 24 is provided at the tip of the radiation fin 9. In this manner, pressurizing the cover 2 onto the radiation fin 9 via the elastic member 24 allows the elastic member 24 to fill the gap (clearance) when a deformation amount of the elastic biasing part 1 of the cover 2 is insufficient, and increasing the adhesion can improve the cooling performance.

(Seventh Modification)

(FIG. 11)

The radiation fin 9 is bonded to the cover 2 with a brazing material 25 or the like. In this manner, the brazing material 25 fills the gap (clearance) generated at the tip of the radiation fin 9 when pressurizing the cover 2 to reduce the gap, thereby absorbing the variation in the height of the radiation fin 9.

(Eighth Modification)

(FIG. 12)

Each of the radiation fin 9 has a plurality of fin portions, among which a portion fin 9b arranged outside is higher than a fin portion 9a arranged inside. This can reduce the gap (clearance) generated at the tip of the radiation fin 9 when the deformation amount of the elastic biasing part 1 is small when pressurizing the cover 2.

According to an embodiment of the present invention described above, the following working effects are provided.

(1) The semiconductor device 100 includes: a plurality of power modules 3 each having a semiconductor element 18; a plurality of heat dissipation bases 12 arranged on a radiation surface side of the plurality of power modules 3 via a heat dissipation member 5 and having radiation fins 9; a frame 8 having a plurality of openings 8a; and a cover 2 forming a refrigerant flow path by covering the heat dissipation base 12 and the frame 8. In the semiconductor device 100, the plurality of heat dissipation bases 12 close the plurality of openings 8a, respectively, and the cover 2 has an elastic biasing part 1 on a surface that contacts the radiation fin 9 and biases the heat dissipation base 12 by pressurizing the heat dissipation base 12 toward the power module 3. In this manner, the semiconductor device 100 that improves both productivity and heat dissipation can be provided.

(2) The heat dissipation base 12 closes the openings 8a via the seal member 7, and the seal member 7 is made of a material deformable in a direction from the heat dissipation base 12 toward the power module 3. In this manner, the adhesion of the openings 8a is improved.

(3) The heat dissipation base 12 is provided on both sides of the power module 3. In this manner, the cooling performance is improved.

(4) Screwing parts 15 are provided at four corners of the biasing part 1, respectively. In this manner, pressurizing force is obtained and connection reliability is improved.

(5) The heat dissipation base 12 closes the openings 8a. In this manner, bonding reliability is improved.

(6) Each of the heat dissipation base 12 is provided with a plurality of power modules 3, 4. In this manner, it is possible to reduce the pressure on the junction while retaining the pressurizing force, thereby improving reliability.

(7) The plurality of power modules 3, 4 are mounted on the printed board 20. In this manner, it is possible to improve assemblability and the heat dissipation, further making it easier to take a reference plane 21.

(8) The plurality of power modules 3, 4 are mounted on the printed board 20 with one side thereof aligned with a predetermined reference plane 21, in which the plurality of power modules 3, 4 are arranged with respect to each heat dissipation base on one side of the plurality of power modules 3, 4, and a single power module 3 (4) is arranged with respect to each heat dissipation base on the other side of the plurality of power modules 3, 4. In this manner, it is possible to absorb a thickness tolerance (variation) of the power module 3 on one side of the power module 3 when pressurizing the power module 3.

(9) The plurality of power modules 3a, 3b have calorific values different from each other, and the refrigerant flow path 22 forms a flow path from the power module 3b dissipating more heat toward the power module 3a dissipating less heat. In this manner, cooling effect is improved.

(10) Each of the refrigerant flow path 22 has flow paths 22a, 22b flowing in opposite directions, in which the flow path 22a has a larger flow path width than that of the flow path 22b. This reduces the pressure loss.

(11) An elastic member 24 is provided between the radiation fin 9 and the cover 2. In this manner, the cooling performance can be improved.

(12) The brazing material 25 is provided between the radiation fin 9 and the cover 2. In this manner, it is possible to absorb the variation in the height of the radiation fin 9.

(13) The radiation fin 9 has a plurality of fin portions 9a, 9b, and the fin portion 9b arranged outside is higher than the fin portion 9a arranged inside among the fin portions 9a, 9b included in the radiation fin 9. In this manner, it is possible to reduce the gap (clearance) generated at the tip of the radiation fin 9 when the deformation amount of the elastic biasing part 1 is small when pressurizing the cover 2.

It should be noted that the present invention is not limited to the embodiments described above, but various modifications and other configurations can be made without departing from the spirit of the invention. Moreover, the present invention is not limited to those including all the configurations described in the above embodiments, but encompasses those with a part of the configuration omitted.

LIST OF REFERENCE SIGNS

100: semiconductor device
1: elastic biasing part
2: cover
3, 4: power module
3*a*: diode
3*b*: IGBT
5: heat dissipation member (TIM)
6: insulating member
7: joining member (seal member)
8: frame
8*a*: through hole (opening)
9: radiation fin
9*a*: short fin portion
9*b*: long fin portion
10: piping component
11: flow path entrance
11*a*: flow path inlet
11*b*: flow path outlet
12: heat dissipation base
14: fastening member
15: connection member
16: sealing member (seal member)
17: first circuit
18: semiconductor element
19: second circuit
20: printed board
20*a*: board through hole (board opening)
21: reference plane
22: flow path
22*a*: thick flow path
22*b*: narrow flow path
23: SiC
24: elastic member
25: brazing material

The invention claimed is:

1. A semiconductor device comprising:
a plurality of power modules each having a semiconductor element;
a plurality of heat dissipation bases arranged on a radiation surface side of the plurality of power modules via a heat dissipation member interposed therebetween and having radiation fins;
a frame having a plurality of openings; and
a cover forming a refrigerant flow path by covering the heat dissipation base and the frame,
wherein the plurality of heat dissipation bases close the plurality of openings, respectively, and
wherein the cover has an elastic biasing part on a surface that contacts the radiation fin and biases the heat dissipation base by pressurizing the heat dissipation base toward the power module.

2. The semiconductor device according to claim 1,
wherein the heat dissipation base closes the opening via a seal member, and
wherein the seal member is made of a material deformable in a direction from the heat dissipation base toward the power module.

3. The semiconductor device according to claim 1,
wherein the heat dissipation base is provided on both sides of the power module.

4. The semiconductor device according to claim 1,
wherein screwing parts are provided at four corners of the biasing part, respectively.

5. The semiconductor device according to claim 1,
wherein the heat dissipation base closes the openings.

6. The semiconductor device according to claim 1,
wherein each of the heat dissipation bases is provided with a plurality of power modules.

7. The semiconductor device according to claim 1,
wherein the plurality of power modules are mounted on a printed board.

8. The semiconductor device according to claim 7,
wherein the plurality of power modules are mounted on the printed board with one side thereof aligned with a predetermined reference plane,
wherein the plurality of power modules are arranged with respect to each heat dissipation base on one side of the plurality of power modules, and
wherein a single power module is arranged with respect to each heat dissipation base on the other side of the plurality of power modules.

9. The semiconductor device according to claim 1,
wherein the plurality of power modules have calorific values different from each other, and
wherein the refrigerant flow path forms a flow path from the power module dissipating more heat toward the power module dissipating less heat.

10. The semiconductor device according to claim 1,
wherein each of the refrigerant flow path has flow paths flowing in opposite directions, and
wherein one of the flow paths has a larger flow path width than that of the other of the flow paths.

11. The semiconductor device according to claim 1,
wherein an elastic member is provided between the radiation fin and the cover.

12. The semiconductor device according to claim 1,
wherein a brazing material is provided between the radiation fin and the cover.

13. The semiconductor device according to claim 1,
wherein the radiation fin has a plurality of fin portions, and
wherein a fin portion arranged outside is higher than a fin portion arranged inside among the fin portions included in the radiation fin.

* * * * *